United States Patent
Schuh et al.

(10) Patent No.: US 6,316,863 B1
(45) Date of Patent: Nov. 13, 2001

(54) PIEZO ACTUATOR WITH NOVEL CONTACTING AND PRODUCTION METHOD

(75) Inventors: Carsten Schuh, Baldham; Clemens Scherer, Gilching; Wilhelm Hekele, Eggstätt; Christoph Hamann, Kirchheim, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/341,719
(22) PCT Filed: Mar. 31, 1998
(86) PCT No.: PCT/DE98/00917
  § 371 Date: Jul. 15, 1999
  § 102(e) Date: Jul. 15, 1999
(87) PCT Pub. No.: WO98/47187
  PCT Pub. Date: Oct. 22, 1998

(30) Foreign Application Priority Data
Apr. 14, 1997 (DE) .................................. 197 15 488
(51) Int. Cl.$^7$ ................................................ H01L 41/08
(52) U.S. Cl. ................................. 310/328; 31/366
(58) Field of Search .......................... 310/328, 366, 310/365

(56) References Cited

U.S. PATENT DOCUMENTS

| | | | |
|---|---|---|---|
| 4,011,474 | * 3/1977 | O'Neill | 310/328 |
| 4,641,052 | * 2/1987 | Kobayashi | 310/328 X |
| 4,725,753 | * 2/1988 | Lien et al. | 310/328 |
| 5,087,848 | * 2/1992 | Kelley et al. | 310/328 |
| 5,295,288 | * 3/1994 | Dam et al. | 310/328 X |
| 5,485,437 | * 1/1996 | Gregg | 310/328 X |

FOREIGN PATENT DOCUMENTS

| | | |
|---|---|---|
| 33 30 538 A1 | 3/1985 | (DE) . |
| 38 32 658 A1 | 4/1989 | (DE) . |
| 196 15 695 C1 | 3/1997 | (DE) . |
| 0 584 842 | 2/1994 | (EP) . |
| 3-4576 A | 10/1991 | (JP) . |

* cited by examiner

Primary Examiner—Mark O. Budd
(74) Attorney, Agent, or Firm—Schiff Hardin & Waite

(57) ABSTRACT

In the operation of piezoactuators of multilayer construction, during the polarizing or during the operation of the piezo-actuator tears can arise, due to voltages, in the metallization strips that are attached to the actuator on the outside for contacting the electrode layers. It is inventively proposed to install electrically conductive contact lugs directly at the stack or on the metallization strips such that a laterally protruding region remains, so that, even given arising tears, these nevertheless extend in the protruding region of the contact lug, and the tears are electrically bridged. Electrical terminal elements are provided so as the project above or laterally at the contact lugs.

8 Claims, 3 Drawing Sheets

PIEZO ACTUATOR WITH NOVEL CONTACTING AND PRODUCTION METHOD

BACKGROUND OF THE INVENTION

Piezoactuators usually consist of several piezoelements arranged in a stack. Each of these elements in turn consists of a piezoceramic layer which is provided with metal electrodes on both sides. If a voltage is applied at these electrodes, the piezoceramic layer responds with a grid deformation which extends along a main axis to a useful longitudinal extent. Since this in turn amounts to less than 0.2% of the layer density along the main axis, a correspondingly higher layer thickness of active piezoceramic must be made available in order to achieve a desired absolute longitudinal extent. However, the voltage required for the actuation of the piezoelement rises with increasing layer thickness of the piezoceramic layer within a piezoelement. To keep this voltage within manageable limits, multilayer actuators are produced wherein the thickness of individual piezoelements is usually between 20 and 200 $\mu$m.

Known piezoactuators of multilayer construction thus consist of up to a few hundred individual layers altogether. For their production, piezoceramic green foils are arranged in a stack in alternation with electrode material, and these are laminated and sintered together into a monolithic compound up to about 5 mm high. Larger actuators with larger absolute excursion can be obtained by gluing together several such stacks, for example. Only piezoactuators of fully monolithic multilayer construction have sufficiently high rigidities, particularly when large forces must be transmitted with the piezoactuator.

For the electrical contacting of such piezoactuators of multilayer construction, metallization strips are attached to the exterior of the piezoactuator, for example, or in a borehole in the middle of the surface of the individual actuator. To connect every second electrode layer with one of the metallization strips, for example, this must be insulated against the intervening electrode layers. This occurs easily in that every other electrode layer comprises a recess in the region of the one metallization strip, in which recess said electrode layer is not led to the metallization strip. The remaining electrode layers then comprise the recesses in the region of the second metallization strip, in order to enable a contacting with alternating polarity. Wires for the electrical connection are soldered to the metallization strips.

Piezoactuators whose alternating contacting occurs via recesses of the electrode layers are piezoelectrically inactive in the contacting zone, since an electrical field cannot build up there due to the one electrode that is missing, respectively. As a result, in the polarization as well as in the operation of the piezoactuator, mechanical tensions build in this piezoelectrically inactive contacting zone, which tensions can lead to tears in the inactive regions and thus at the metallization strips parallel to the electrode layers as well. This can lead to the complete splitting of the metallization strip and produces the result that, given punctate voltage supply to the metallization strips from outside, a part of the piezoactuator becomes dependent on the power supply and thus becomes inactive. The number of tears depends on the total height of the actuator and on the stability of the boundary surface between the inner electrode and the piezoceramic and can rise in continuous operation given alternating load conditions. Since, in the dynamic operation, a dynamic changing of the tears, or respectively, the tear openings also derives, the metallization strips are thereby further damaged during the operation of the actuator.

SUMMARY OF THE INVENTION

It is the object of the present invention to propose a ceramic actuator, along with a method for production, which has electrical contacting that can be handled securely and easily and which demonstrates an increased stability with respect to a tear formation.

The inventive actuator can have a conventional and preferably a monolithic construction. Piezoelectric ceramic layers and electrode layers are arranged upon one another in alternation in the manner of a stack and are preferably sintered together. For alternating contacting of the electrode layers, at least two electrically conductive contact lugs are inventively provided at the stack on the outside. These are connected to the electrode layers via an edge and extend over the entire height of the electrically active region of the stack. To the side of the connected edge, they comprise a protruding region, and in the region of the outer edge that is averted from the stack, they comprise an electrical terminal element which projects laterally or which projects beyond the stack in height.

With the contact lug, it is possible to bridge, in an electrically conductive manner, tears in the metallizations that may arise in the operation of the actuator. If the projecting region is selected so as to be sufficiently wide, then the tears end inside the contact lug, or respectively, inside the projecting region. All individual elements of the actuator thus remain electrically functional, even if tears arise at the metallizations. The inventive actuator thus does not demonstrate any power losses whatsoever in operation.

The terminal element at the outer edge enables the simple connection of the contact lug to an external current or voltage supply. It protrudes beyond the contact lug laterally or beyond the stack in height and is thus still easily accessible given the installation of the stack in a housing and enables a simple current connection.

In the simplest embodiment, the terminal element is produced from the material of the contact lug, or respectively, is an integral component of the contact lug. This comprises at least one electrically conductive layer. It preferably consists of a compound material with at least one plastic film and at least one metallic film or layer, however. This type of compound material comprises a high flexibility and a high elasticity and resistance to tearing, at the same time. Geometrically, the terminal element represents an extension of the outer edge, which is averted from the stack, of the contact lug in an upward direction, or an extension of the upper edge to the outside, or respectively, to the side. Besides the thus simplified connection, the terminal element also serves for easier handling of the contact lug, or respectively, of the actuator that is provided with the contact lug, particularly during the installation into a housing. The terminal elements can serve as a guide here.

The terminal element is preferably constructed such that it represents an additional mechanical reinforcement of the outer edge of the contact lug. In an advantageous development, the terminal element is constructed as a metallic terminal pin. This can be soldered or otherwise electrically conductively fastened on the contact lug, or respectively, on its metallic layer. The terminal pin can extend over the entire outer edge or can be connected only to a part of the edge. The guidance, or respectively, handling of the contact lug that is fastened at the stack is simplified with a mechanically reinforcing terminal element such as this.

The terminal element, which is constructed as a terminal pin, can also be part of an electrical plug connection. This enables an extremely simple connection to an electrical voltage source.

The actuator preferably comprises a pressure plate at a face of the stack. This has openings through which the terminal elements are inserted or guided. In mechanically reinforced terminal elements, the openings are designed such that a guidance and retaining of the terminal elements is guaranteed.

The pressure plate preferably has a recess for fixing the stack. This enables a secure installation of the stack, including the contact lug, in an actuator housing, whereby the stack is securely oriented and centered.

In the pressure plate, other elements of the actuator can be integrated, such as force sensors, temperature sensors, other sensors (e.g. Hall sensors) or a second actuator as an adjusting element for rigidity, temperature expansion compensation and zeroizing.

For the mechanical protection of the stack in the actuator, this has a plastic envelope. For this purpose, the stack is preferably cast into a plastic sheath or coated with a plastic. Elastomers on a silicon resin base are particularly suitable for this. The installation into the plastic sheath can occur with the aid of the pressure plate, whereby a simple guidance and fixing of the stack, contact lug and terminal element is achieved.

In the longitudinal direction of the actuator, the other previously mentioned elements which complete the actuator can be simultaneously installed in the envelope, in the casting or coating with plastic as long as they are not installed elsewhere, e.g. in the pressure plate.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
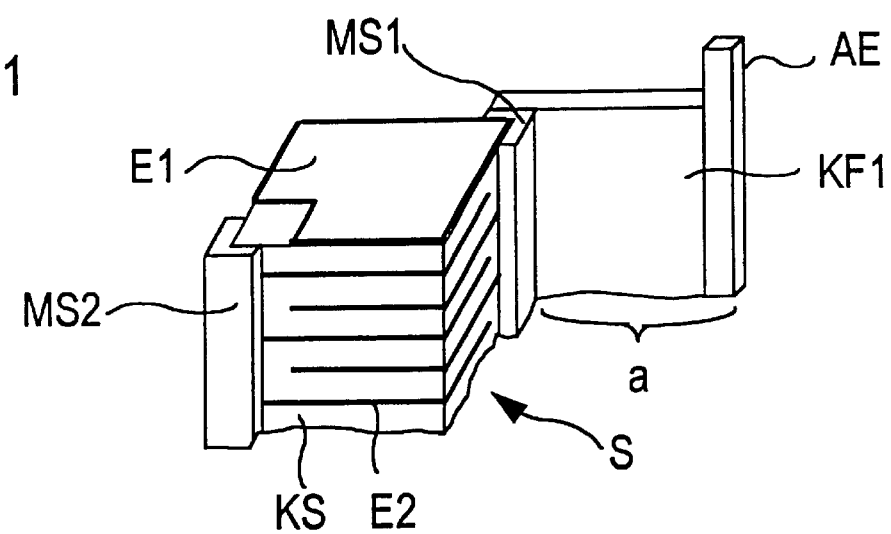
FIG. 1 shows a schematic view of an actuator with contact lug and terminal element, in perspective view.

FIG. 1 illustrates a section of an inventive actuator, whereby, for the sake of clarity, only one contact lug KF is illustrated. The core of the actuator is the stack S, which is assembled from electrode layers E1, E2 and ceramic layers KS in alternating fashion. The actuator, which is illustrated here with a square floor area, is provided with metallization strips MS at opposite corners, which strips are respectively connected to every other electrode, due to the geometric design of the electrodes E, so that a parallel connection of all individual actuator elements is possible. A contact lug KF1 is fastened at the first metallization strip MS1 over its entire height with one edge such that a part, or respectively, the remainder of the contact lug projects laterally at the stack. In the region of the outer edge, which is averted from the stack, a terminal element AE is arranged, which projects beyond the stack in height or laterally. While the width of the protruding region a is sufficiently selected such that tears in the metallization and particularly in the metallization strips MS which arise during the operation or the poling of the actuator end within the contact lug KF, the extent to which the terminal element AE projects beyond the contact lug KF, or respectively, the stack S in height or laterally depends on the further construction of the actuator, its housing or the other electrical terminals.

Figure 2:
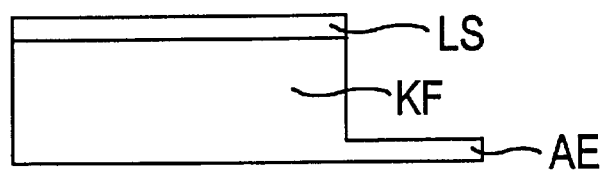
FIGS. 2 to 4 show various contact lugs in a schematic view.

FIG. 2 shows the simplest development of the invention, wherein the contact lug and terminal element are prefabricated from an electrically conductive film, such as a copper-lined plastic film. In the region of its inner edge, the contact lug has a narrow solder layer LS with the aid of which a simple soldering of the contact film to the metallization strip MS is possible. Alternatively, the contact lug can also be fastened directly at the stack, or respectively, at the electrode layers without metallization strips with the aid of the solder layer.

A preferred and gentle method of fastening is laser beam soldering, which only generates a minimal thermal load on the heat-sensitive multilayer structure.

Figure 3:
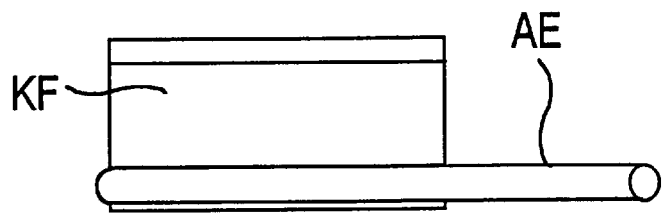

FIG. 3 shows another development of the contact lug KF, which in turn is constructed as a film with at least one electrically conductive layer. The terminal element AE is constructed here as a metallic terminal pin which is electrically conductively connected to the contact lug KF in the region of an outer edge and is soldered on, for example. The terminal pin comprises a round cross-section, for example.

Figure 4:
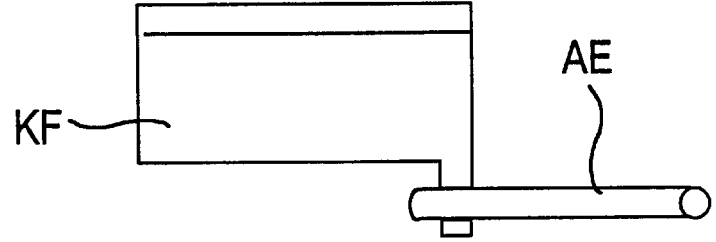

FIG. 4 depicts an additional possible development of the contact lug KF in which the terminal element AE represents a lateral extension of the contact lug. As is illustrated in the figure, it can be connected to a metallic terminal pin, thus forming a combined terminal element.

In all cases, the contact lug KF is fully fabricated prior to its fastening at the metallizations or directly at the stack; i.e., it is provided with terminal elements AE and with the solder layer LS, as warranted.

During the soldering or otherwise electrically conductive fastening of the contact lug at the metallizations, these are electrically shorted, in order to prevent a damaging of the (for instance) piezoelectric actuator via the pyroelectrical effect. Using the same measure, damage is always avoided in later processing steps when thermal loading of the stack can be expected.

Figure 5:
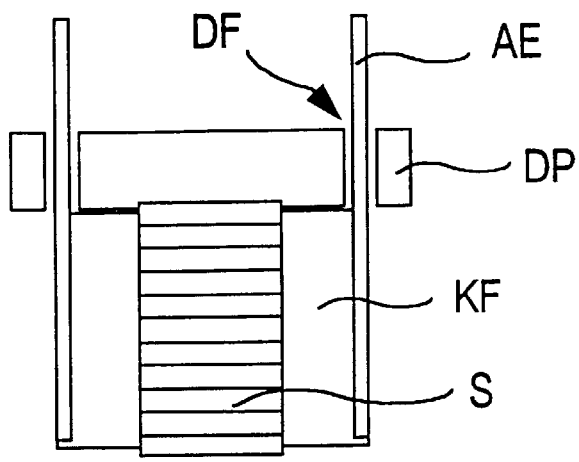
FIGS. 5 and 6 show schematic cross-sections through inventive actuators with pressure plates.

FIG. 5 depicts a submodule of the actuator, consisting of the stack S, which is provided with the contact lugs KF, and a pressure plate DP, which comprises bushings for the terminal elements AE. Particularly in mechanically reinforced terminal elements, such as the metallic terminal pins, the bushings DF serve to lead and restrain both the terminal elements and the connected contact lug KF. The pressure plate DP is arranged over a face of the stack S and comprises a depression 50 to 100 $\mu$m deep which is adapted to the face for purposes of fixing the stack. With this submodule, the further processing, such as the installation into an actuator housing, is simplified, since the orienting and centering of the actuator, which is necessary for an optimal transmission of forces, is simplified by the fixing of stack S, contact lug KF and terminal elements AE in the pressure plate DP.

Figure 6:
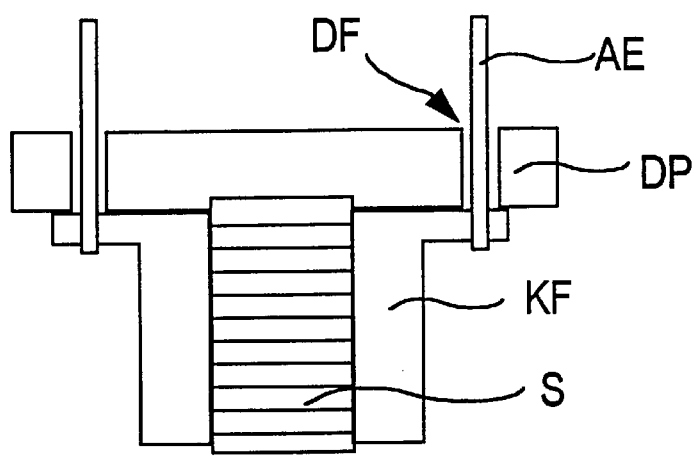

FIG. 6 shows a modified submodule with contact lugs KF and terminal elements AE which are fashioned according to FIG. 4. As in FIG. 5, here also the terminal elements are fixed in lead-throughs DF, and the stack is fixed in a recess of the pressure plate. In this development it is possible to first secure the contact lugs at the metallization strips of the stack S without terminal elements AE, and to connect the pressure plate DP fixedly to the terminal elements AE. In this embodiment, an electrically conductive connection of the terminal elements to the contact lugs is performed after the joining of pressure plate and stack, by soldering, for example. This embodiment has the advantage that the pressure plate and terminal elements form a secure unit which can simultaneously serve as a plug contact for connection to a current/voltage source. The sealing of the lead-throughs can be done without regard for a mechanical of thermal loading or the actuator and can thus be constructed particularly tight.

Figure 7:
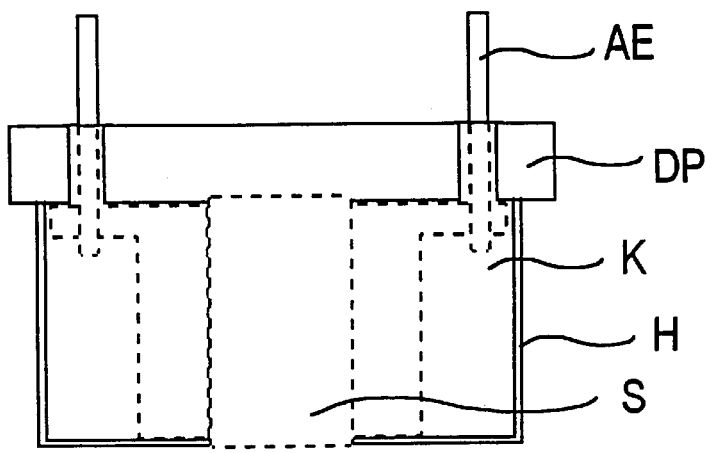
FIG. 7 shows a schematic cross-section of an actuator with a plastic sheath.

FIG. 7: The submodule of pressure plate, terminal elements, contact lugs and stack is provided with an envelope for electrical passivation and for mechanical protection. In the exemplifying embodiment, a sheath H is provided for this purpose, which consists of plastic or metal, for example, is adapted to the size of the submodule, and closes with the pressure plate in a sealed manner. In this sheath H, the submodule is inserted and is subsequently cast or coated with plastic K, e.g. a silicon elastomer, via an opening which remains open. Not only are all electrically active surfaces of the stack and of the contact lugs insulated electrically and from environmental influences, but a mechanically secure connection between sheath H, pressure plate DP and stack S is also produced. Given a plastic sheath H, the bottom face of the stack thus remains free, since a better force transmission is possible with the preferably ceramic face of the stack than with the sheath.

Prior to the casting or injection of the submodule into a sheath, it is possible to additionally passivate the electrically active surfaces of the ceramic multilayer stack S, particularly by the deposition of an electrically insulating, sufficiently elastic plastic compound, such as a silicon elastomer. The passivation is simplified by the retaining of the contact lug via the terminal elements that are fixed in the pressure plate. In addition, the passivation prevents a short between a contact lug and an electrically active surface region of the stack due to mechanical forces which arise in the coating or casting and which act on the contact lugs KF, which short could lead to a malfunctioning of the actuator.

If the deposition of the passivation occurs prior to the production of a submodule from the stack and pressure plate, then the flexible contact lugs KF can be fixed elsewhere via the terminal elements AE, so that the passivation, e.g. by pencil deposition, is simplified. To this end, the terminal elements and potentially the stack as well can be fixed in an auxiliary holding device. The passivation of the stack surfaces prior to the assembling of said submodule has the advantage that, prior to further processing, the contact lugs KF can now be arranged nearer the stack and can also be placed adjacently, for example. This enables a space-efficient arrangement in a sheath H. A stack with contact lugs that are adjacent at the side surfaces is mechanically more stable and is also protected against mechanical damage during the installation in the sheath or in an actuator housing. In a development of the invention, it is possible to press the contact lugs to the side faces of the stack and to fix them there, for example by means of an elastic plastic ring which is pushed over the stack along with the adjacent contact lugs and terminal elements and which presses the contact lugs and terminal elements tightly to the stack.

Figure 8:
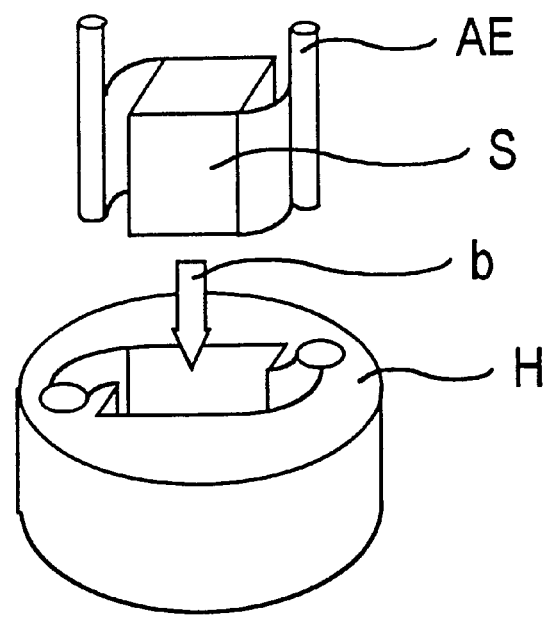
FIG. 8 shows a schematic perspective view of the installation of a stack into a plastic sheath.

FIG. 8 illustrates another development of the invention with which a secure installation of the stack together with the contact lug and terminal elements in a plastic sheath H is possible. The plastic sheath is not constructed as an empty hollow cylinder but rather already comprises an inner profile which is adapted to the, geometric shape of the stack, contact lug and terminal elements. Subsequent to the insertion of the stack into the preformed inner profile of the sheath H (see arrow b), the stack as well as the contact lugs and terminal elements are sufficiently fixed. In the subsequent filling of the remaining interspaces to the inner profile with plastic, a damaging of the contact lugs, or respectively, an undesirable short between contact lugs and potentially exposed electrically active surfaces of the stack, is avoided. In this embodiment also, the terminal elements AE as well as the stack S can be fixed in a holding device such as a pressure plate DP (not illustrated in FIG. 8) in order to enable a simple insertion of the stack into the sheath H and also the enable a one-sided hermetically tight sealing of the stack in the sheath.

Figure 9:
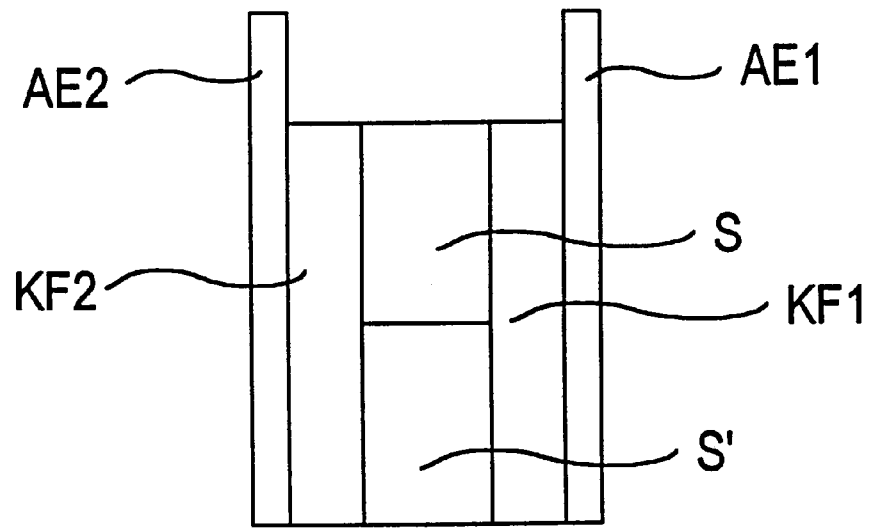
FIG. 9 shows an actuator which is assembled from several stacks.

FIG. 9 depicts another development of the invention, which can be combined with all the illustrations previously described. This comprises a multilayer construction consisting of two stacks S, S' that are arranged one on top of the other, the stacks S and S' being connected by means of common contact lugs KF and thus fixed relative to one another. Mechanically reinforced terminal elements AE such as metallic terminal pins additionally stabilize the arrangement. In this way, it is possible to achieve the necessary total height of the multilayer construction and thus of potential excursion of the actuator, despite the low stacks, which are technologically easier to produce, and also to achieve a simple and elegant connection of the two substacks S, S'. Auxiliary holding can also serve here for early centering of a plurality of stacks over one another, it being possible for these to be already arranged at a pressure plate and oriented. This simplifies the laser beam soldering of the common contact lugs KF to the stacks S and S' and also facilitates the centering of the stack in the injection molding.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A ceramic actuator, comprising:
    a multilayer construction, having at least one stack of alternating electrode layers and ceramic layers;
    at least two strip-shaped electrically conductive contact lugs which are attached to the stack laterally;
    each contact lug being connected to the electrode layers in an electrically conductive manner via an edge, and each contact lug having a protruding region to a side of said edge;
    an electrical terminal element on each contact lug in a region of an outer edge of the contact lug that is averted from the stack, said element being one of projecting beyond the contact lug laterally or beyond the stack in height; and
    the terminal element has a metallic terminal pin which mechanically reinforces the outer edge of the contact lug and which extends along the outer edge over an entire height of the contact lug.

2. The ceramic actuator according to claim 1, wherein the terminal element has a strip-shaped extension of the contact lug which is connected to the metallic terminal pin.

3. The ceramic actuator according to claim 2, wherein a pressure plate is arranged over a face of the stack, through which plate the terminal pins are inserted and fixed thereto.

4. The ceramic actuator according to claim 1, wherein the terminal pins are each constructed as a plug contact.

5. The ceramic actuator according to claim 3, wherein there is a recess provided in the pressure plate, in which recess the stack is fixed.

6. The ceramic actuator according to claim 1, wherein the stack and the contact lugs are coated with plastic on all sides or are cast in a compact plastic envelope, and wherein the electrical terminal elements are led out of the plastic envelope at a face side thereof.

7. The ceramic actuator according to claim 6, wherein the plastic envelope is constructed from a silicon elastomer.

8. The ceramic actuator according to claim 1, wherein several stacks are arranged one upon the other and are connected to common terminal lugs.

* * * * *